(12) United States Patent
Kolb et al.

(10) Patent No.: US 9,818,934 B2
(45) Date of Patent: Nov. 14, 2017

(54) HALL EFFECT DEVICE

(71) Applicant: Infineon Technologies AG, Neubiberg (DE)

(72) Inventors: Stefan Kolb, Unterschleissheim (DE); Markus Eckinger, Regenstauf (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/349,004

(22) Filed: Nov. 11, 2016

(65) Prior Publication Data

US 2017/0062704 A1 Mar. 2, 2017

Related U.S. Application Data (60) Division of application No. 14/933,351, filed on Nov. 5, 2015, now Pat. No. 9,520,551, which is a continuation of application No. 13/613,986, filed on Sep. 13, 2012, now Pat. No. 9,217,783.

(51) Int. Cl.
| | | |
|---|---|---|
| *G01R 33/07* | (2006.01) | |
| *H01L 27/22* | (2006.01) | |
| *H01L 29/82* | (2006.01) | |
| *H01L 43/06* | (2006.01) | |
| *G01R 33/00* | (2006.01) | |
| *H01L 43/14* | (2006.01) | |
| *H01L 43/04* | (2006.01) | |

(52) U.S. Cl.
CPC ........ *H01L 43/065* (2013.01); *G01R 33/0035* (2013.01); *G01R 33/0052* (2013.01); *G01R 33/07* (2013.01); *G01R 33/075* (2013.01); *H01L 27/22* (2013.01); *H01L 43/04* (2013.01); *H01L 43/14* (2013.01)

(58) Field of Classification Search
CPC ..................................................... G01R 33/07
USPC ......................................................... 324/251
See application file for complete search history.

(56) References Cited

U.S. PATENT DOCUMENTS

| | | | |
|---|---|---|---|
| 7,902,820 | B2 | 3/2011 | Vervaeke et al. |
| 2008/0150522 | A1 | 6/2008 | Hikichi |
| 2009/0261821 | A1 | 10/2009 | Motz |
| 2012/0001279 | A1 | 1/2012 | Hioka et al. |

(Continued)

OTHER PUBLICATIONS

H.-J. Lippmann, F. Kuhrt. "Influence of geometry on the Hall effect in rectangular semiconductor plates." English Abstract Provided. Original German title—"Der Geometriefaktor auf den Hall-Effekt bei rechteckigen Halbleiterplatten". Laboratorium der Simens-Schucket Werke AG. Published in 1958. 11 Pages.

(Continued)

*Primary Examiner* — Bot Ledynh
(74) *Attorney, Agent, or Firm* — Eschweiler & Potashnik, LLC (57) ABSTRACT

A hall effect device includes an active Hall region in a semiconductor substrate, and at least four terminal structures, each terminal structure including a switchable supply contact element and a sense contact element, wherein each supply contact element includes a transistor element with a first transistor terminal, a second transistor terminal, and a control terminal, wherein the second transistor terminal contacts the active Hall region or extends in the active Hall region; and wherein the sense contact elements are arranged in the active Hall region and neighboring to the switchable supply contact elements.

9 Claims, 10 Drawing Sheets

(56) References Cited

U.S. PATENT DOCUMENTS

| | | |
|---|---|---|
| 2012/0001280 A1 | 1/2012 | Hioka et al. |
| 2012/0016614 A1 | 1/2012 | Hohe et al. |
| 2012/0200290 A1* | 8/2012 | Ausserlechner ............. 324/251 |
| 2012/0286776 A1* | 11/2012 | Ausserlechner et al. ..... 324/251 |

OTHER PUBLICATIONS

J. Häussler, "The geometrical function of four-electrode Hail generators" English Abstract Provided. Original German Title—"Die Geometriefunktion vierelektrodiger Hallgeneratoren", Archiv für Elektrotechnik vol. 52. Published in 1968. 10 Pages.

Non-Final Office Action dated Apr. 23, 2015 for U.S. Appl. No. 13/613,986.

Notice of Allowance dated Aug. 14, 2015 for U.S. Appl. No. 13/613,986

Non-Final Office Action dated Apr. 5, 2016 for U.S. Appl. No. 14/933,351.

Notice of Allowance dated Aug. 12, 2016 for U.S. Appl. No. 14/933,351.

\* cited by examiner

HALL EFFECT DEVICE

REFERENCE TO RELATED APPLICATION

This application is a divisional of U.S. application Ser. No. 14/933,351 filed on Nov. 5, 2015, which is a continuation of U.S. application Ser. No. 13/613,986 filed on Sep. 13, 2012, now U.S. Pat. No. 9,217,783 issued on Dec. 22, 2015, the contents of which are incorporated by reference in its entirety.

FIELD

Embodiments relate to a Hall effect device indicative of a magnetic field. Some embodiments relate to a Hall effect device or a Hall sensor with operated terminals. Some embodiments relate to a method of manufacturing a Hall effect device indicative of a magnetic field. Moreover, some embodiments relate to a method of calibrating a Hall effect device indicative of a magnetic field.

BACKGROUND

Hall effect devices are magnetic field sensors that are adapted to sense a magnetic field based on the Hall effect. Moreover, Hall effect devices can be used for a variety of applications, such as proximity switching, positioning, speed detection and current sensing applications.

However, a major drawback of Hall effect devices (Hall plates or Hall sensors) is their high offset voltage, i.e. the output voltage at the sense contacts in the absence of a magnetic field component perpendicular to the surface of the active Hall region of the Hall effect device. Also contributing to the offset are all physical effects which cause an asymmetry in the potential distribution of the active Hall region. Possible sources include piezoresistive effects, geometrical errors, temperature gradients, non-linear material properties, etc. Additionally, the various offset sources may change over the lifetime of the Hall effect device.

SUMMARY

Embodiments provide a Hall effect device indicative of a magnetic field. The Hall effect device comprises an active Hall region in a semiconductor substrate, and at least four terminal structures, each terminal structure comprising a switchable supply contact element and a sense contact element, wherein each supply contact element comprises a transistor element with a first transistor terminal, a second transistor terminal, and a control terminal, wherein the second transistor terminal contacts the active Hall region or extends in the active Hall region; and wherein the sense contact elements are arranged in the active Hall region and neighboring to the switchable supply contact elements.

Moreover, embodiments provide a method of manufacturing a Hall effect device indicative of a magnetic field. The method comprises providing an active Hall region of a first semiconductor type formed in or on top of a substrate, wherein the substrate comprises an isolation arrangement to isolate the Hall effect region in a lateral direction and a depth direction from the substrate or other electronic devices in the substrate. The method further comprises providing four supply contact elements at the active Hall region, wherein each supply contact element comprises a transistor element with a first transistor terminal, a second transistor terminal, and a control terminal, wherein the second transistor terminal contacts the active Hall region or extends in the active Hall region. Lastly, the method comprises providing at least four sense contact elements in the active Hall region, wherein the sense contact elements are placed neighboring to the switchable supply contact elements.

BRIEF DESCRIPTION OF THE DRAWINGS

Embodiments of the present invention are described herein making reference to the appended figures.

FIGS. 1d(1)-1d(2) show a principle illustration of different modes of a calibration operation of an example Hall effect device under the control of the associated controller circuit according to another embodiment of the present invention;

DETAILED DESCRIPTION

Before embodiments of the present invention will be described in the following in detail using the accompanying figures, it is to be pointed out that same elements or elements having the same functionality are provided with the same or equivalent reference numbers and that a repeated description of elements provided with the same or equivalent reference numbers is typically omitted. Descriptions provided for elements having the same or equivalent reference numbers are mutually exchangeable.

In the following description, a plurality of details is set forth to provide a more thorough explanation of embodiments of the present invention. However, it will be apparent to one of ordinary skill in the art that embodiments of the present invention may be practiced without these specific details. In other instances, well-known structures and devices are shown in block diagram form rather than in detail in order to avoid obscuring embodiments of the present invention. In other instances, well-known structures and devices are shown in schematic cross-sectional views or top-views rather than in detail in order to avoid obscuring embodiments of the present invention. In addition, features of the different embodiments described herein may be combined with each other, unless specifically noted otherwise.

In the field of Hall effect devices (Hall sensors), the magnetic sensitivity of a Hall effect device depends (among other topics) on the geometry of the sense contacts of the active Hall region (Hall plate). Sense contacts having a small dimension (parallel to the flowing direction of the control or biasing current through the active Hall region) provide a higher magnetic sensitivity than broad Hall signal sense contacts which have a large dimension in a direction parallel to the control or biasing current through the active Hall region. The respective geometry of the sense contacts can effect an increased sensitivity in the range of about 25% or even more.

Figure 1A:
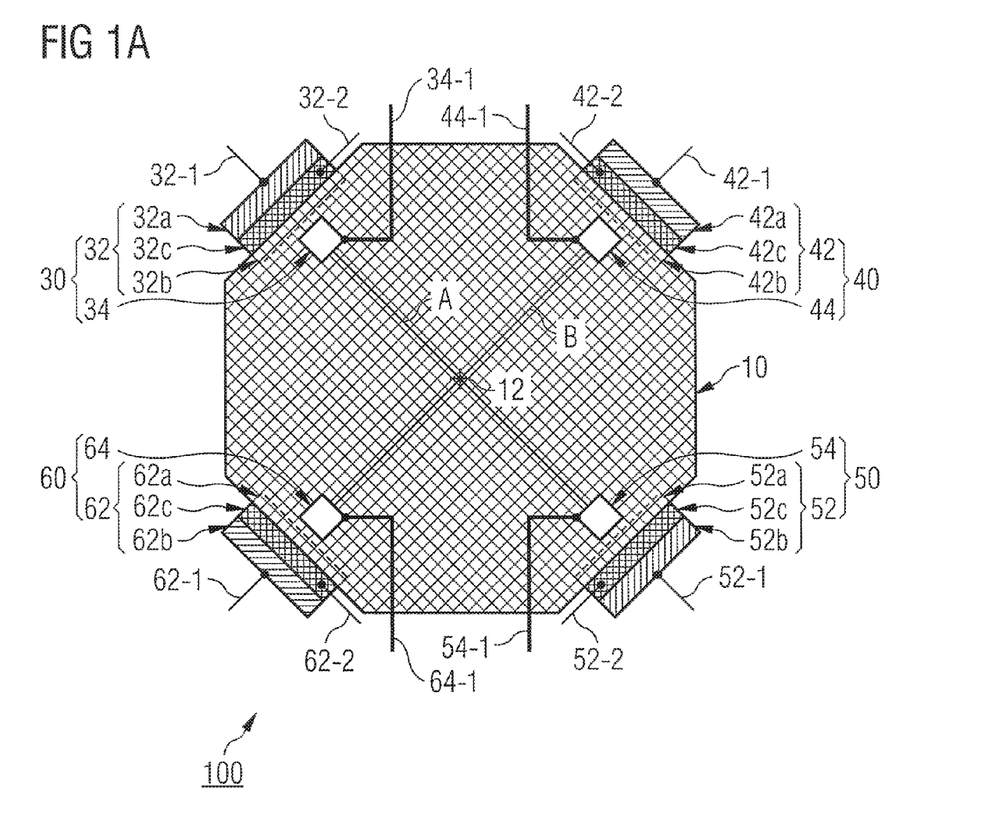
FIG. 1a shows a schematic top view of a Hall effect device according to an embodiment of the present invention.

FIG. 1a shows a schematic top view of a Hall effect device 100 according to an embodiment. The Hall effect device 100 comprises an active Hall region 10 in a semiconductor substrate 20 and at least four terminal structures 30, 40, 50 and 60. Each terminal structure 30, 40, 50 and 60 comprises a switchable supply contact element 32, 42, 52 or 62 and a sense contact element 34, 44, 54, 64. Moreover, each switchable supply contact element 32, 42, 52, 62 comprises a transistor element with a first transistor terminal 32a, 42a, 52a, 62a, a second transistor terminal 32b, 42b, 52b, 62b and a control terminal 32c, 42c, 52c, 62c.

As shown in FIG. 1a, the second transistor terminals 32b, 42b, 52b, 62b contact the active Hall region 10 or extend into the active Hall region 10. Moreover, the sense contact elements 34, 44, 54, 64 are arranged in the active Hall region 10 and neighboring (or adjacent) to the switchable supply contact elements 32, 42, 52, 62.

As shown in FIG. 1a, moreover the sense contact elements 34, 44, 54, 64 may be respectively connected to a connection line (conductor) 34-1, 44-1, 54-1, 64-1. The first transistor terminal of each of the four transistor elements 32, 42, 52, 62 may be respectively connected with a connection line (conductor) 32-1, 42-1, 52-1, 62-1. Moreover, the control terminal 32c, 42c, 52c, 62c may be respectively connected with a connection line (conductor) 32-2, 42-2, 52-2, 62-2. The connection lines 32-1, 42-1, 52-1, 62-1/32-2, 42-2, 52-2, 62-2/34-1, 44-1, 54-1, 64-1 may be provided to electrically connect or couple the different contact elements or terminals of the Hall effect device 100 with a controller or multiplexer circuit (not shown in FIG. 1a).

The transistor elements may comprise either bipolar junction transistors or field effect transistors. Alternatively, at least one of the transistor elements may comprise a bipolar junction transistor, wherein the remaining transistor element(s) may comprise a field effect transistor. Alternatively, at least one of the transistor elements may comprise a field effect transistor, wherein the remaining transistor element(s) may comprise a bipolar junction transistor.

The at least four terminal structures 30, 40, 50, 60 form a first pair of opposing terminal structures 30, 50 and a second pair of opposing terminal structures 40, 60. A first (virtual) conjugation line "A" between the opposing terminal structures 30, 50 of the first pair and a second (virtual) conjugation line "B" between the opposing terminals structures 40, 60 of the second pair orthogonally intersect in a center point 12 of the active Hall region 10.

In other words, the first pair of opposing terminal structures 30, 50 comprises a first pair of opposing supply contact elements 32, 52 and a first pair of opposing sense contact elements 34, 54. The second pair of opposing terminal structures 40, 60 comprises a second pair of opposing supply contact elements 42, 62 and a second pair of opposing sense contacts elements 44, 64.

As shown in FIG. 1a, the terminal structures 30, 50 of the first pair of opposing terminal structures respectively oppose each other with respect to the center point 12 of the active Hall region 10. Further, the terminal structures 40, 60 of the second pair of opposing terminal structures respectively oppose each other with respect to the center point 12 of the active Hall region 10.

In other words, the first pair of opposing terminal structures 30, 50 and the second pair of opposing terminal structures 40, 60 are situated rectangular to each other with respect to the center point 12 of the active Hall region 10.

The Hall effect device 100 may comprise a plate-like active area 10 of homogenous conductivity and of a first semiconductive type (e.g. n-type), and four switchable supply contact elements 32, 42, 52, 62 and four sense contact elements 34, 44, 54, 64 which are positioned in pairs at the boundary of the active Hall region 10. The terminal structures are divided in opposing pairs of contact elements for biasing and another for sensing the output voltage.

As shown in FIG. 1a, the example Hall effect device 100 may have an active Hall region 10 with a boundary line in form of a (regular) octagon.

Figure 1B:
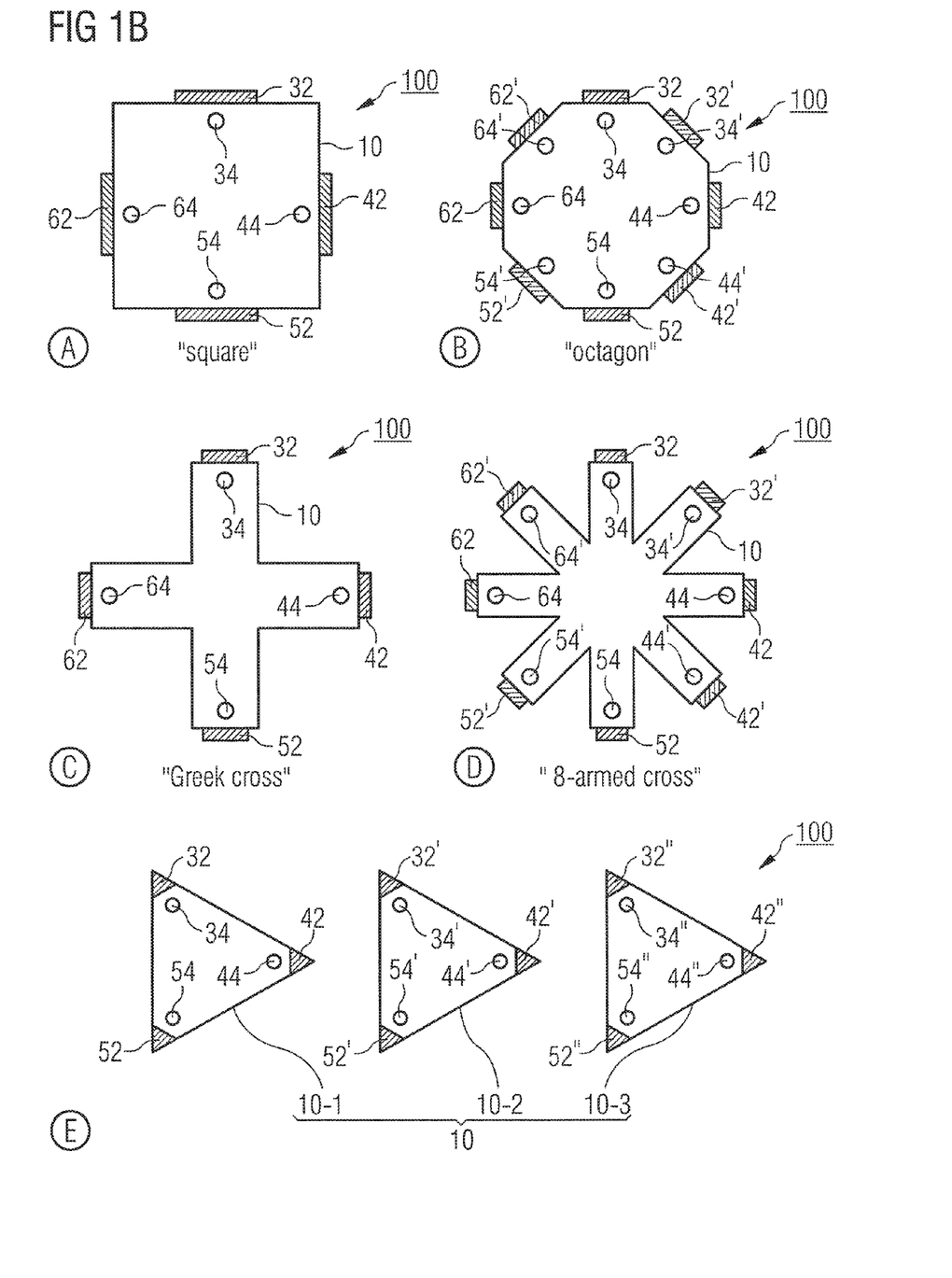
FIG. 1b shows a schematic top view of example forms of the active area of a Hall effect device according to an embodiment of the present invention

FIG. 1b shows a number of example active Hall regions of the Hall effect device 100 with different boundary lines and an example arrangement of the switchable supply contact elements and the sense contact elements.

As shown in FIG. 1b, a basic implementation of the active Hall region 10 of the Hall effect device 100 may have a boundary line, for example, in form of a square (A), an octagon (B), a 4-armed cross (Greek cross) (C) or an 8-armed cross (D). Moreover, the Hall effect device 100 may have a plurality of (or at least three) triangular active sub-regions 10-1, 10-2, 10-3 (E) forming the resulting active Hall region 10.

As shown in FIG. 1b, the Hall effect device 100 having the active Hall region 10 in form of a square or a 4-armed cross (Greek cross) comprises the switchable supply contact elements 32, 42, 52, 62 and the sense contact elements 34, 44, 54, 64 as described above. Moreover, the Hall effect device 100 having the active Hall region 10 in form of an octagon or an 8-armed cross may additionally comprise further switchable supply contact elements 32', 42', 52', 62' and further sense contact elements 34', 44', 54', 64'. The (above and below) explanations of the switchable supply contact elements 32, 42, 52, 62 and the sense contact elements 34, 44, 54, 64 are equally applicable to the further switchable supply contact elements 32', 42', 52', 62' and the further sense contact elements 34', 44', 54', 64'.

In some embodiments, the active hall region 10 may have a boundary line in form of an n-sided regular polygon, wherein n is a multiple of four (where n is 4, 8, 16, . . . ). Moreover, the active Hall region 10 may have m terminal structures with m n and m is a multiple of four (m is 4, 8, 16, . . . ), wherein the terminal structures may be arranged at opposing sides of the regular polygon.

To be more specific, the terminal structures may be arranged in a centered (middle) position with respect to a midpoint of the respective side of the regular polygon. Alternatively, the terminal structures may be arranged at opposing vertices of the regular polygon.

In general, the active hall region 10 may have a boundary line in the form of an n-sided polygon (e.g. a triangle, a quadrilateral, a pentagon, a hexagon, a heptagon, a octagon, a enneagon, a decagon, a hendecagon, a dodecagon, a tridecagon or a higher order polygon), wherein n is at least three. Moreover, the active Hall region 10 may have m terminal structures with m≤n, wherein the terminal structures may be arranged at sides or vertices of the polygon.

As further shown in FIG. 1b, the Hall effect device 100 may have (at least) three triangular active sub-regions 10-1, 10-2, 10-3 which may jointly form the resulting active Hall region 10. The first active sub-region 10-1 may comprise switchable supply contact elements 32, 42, 52 and (respectively associated) sense contact elements 34, 44, 54. The second active sub-region 10-2 may comprise switchable supply contact elements 32', 42', 52' and (respectively associated) sense contact elements 34', 44', 54'. The third active sub-region 10-3 may comprise switchable supply contact elements 32", 42", 52" and (respectively associated) sense contact elements 34", 44", 54".

The switchable supply contact elements 32, 42, 52/32', 42', 52'/32", 42", 52" and the sense contact elements 34, 44, 54/34', 44', 54'/34", 44", 54" of the active sub-regions 10-1, 10-2, 10-3 are selectively interconnected (e.g. by means of a control device) in such a way to form or provide the resulting active Hall device 10.

In some embodiments, the active Hall region 10 may have a boundary line in the form of an n-armed cross, wherein n is a multiple of four (where n is 4, 8, 16 . . . ). Moreover, the active Hall region 10 may have m terminal structures with m≤n and m is a multiple of four (m is 4, 8, 16, . . . ), wherein the m terminal structures are arranged in opposing arms of the n-armed cross.

In general, the active Hall region 10 may have a boundary line in the form of an n-armed cross, wherein n is at least three.

Figure 1C:
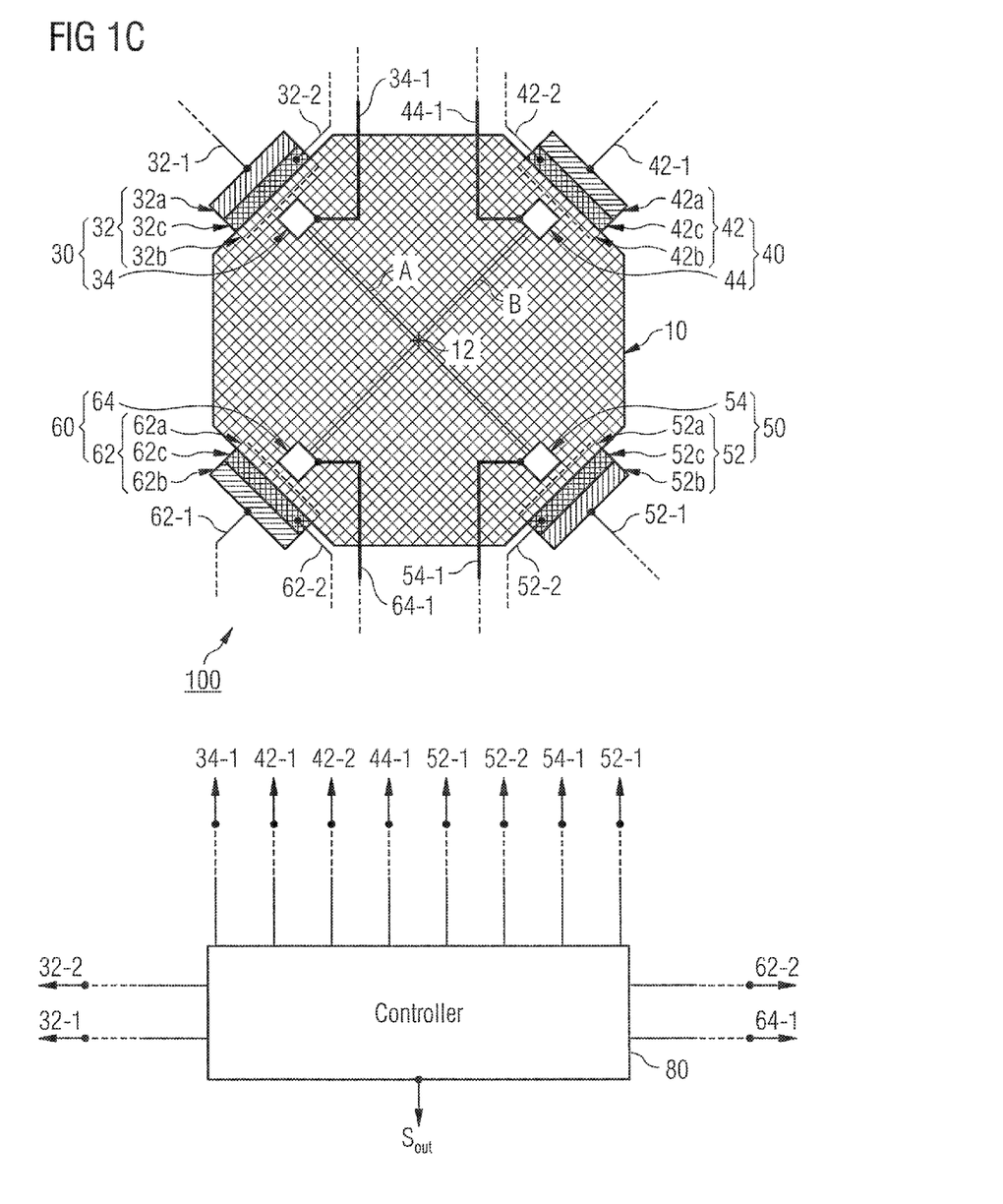
FIG. 1c shows a principle illustration of an example Hall effect device together with an associated controller circuit according to an embodiment of the present invention.
Figure 1D:
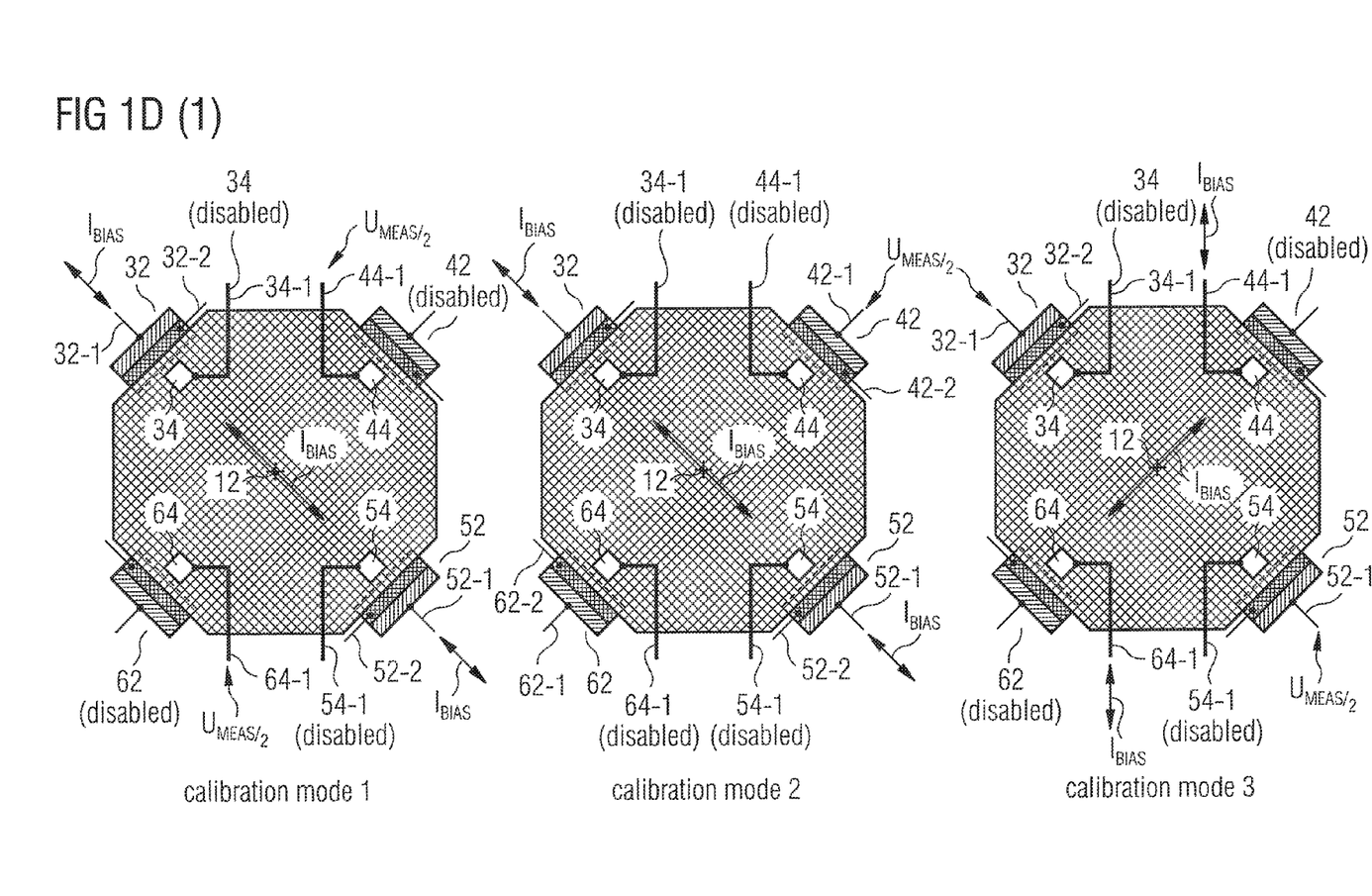

FIG. 1c shows a schematic view of an example Hall effect device 100 further comprising a control circuit 80, e.g. a microcontroller and/or multiplexer, which is electrically connected or coupled to the terminal structures 30, 40, 50, 60 of the Hall effect device over the connection lines 32-1, 42-1, 52-1, 62-1/32-2, 42-2, 52-2, 62-2/34-1, 44-1, 54-1, 64-1.

As shown in FIG. 1c, the coupling of the connection lines 32-1, 42-1, 52-1, 62-1/32-2, 42-2, 52-2, 62-2/34-1, 44-1, 54-1, 64-1 is indicated by means of double-headed arrows for indicating an option of an unidirectional and/or bidirectional communication over at least one connection line or all connection lines. Thus, the control circuit 80 can be configured to output a control or force signal to at least some of the connection lines or to each connection line and is further configured to receive a sense or measuring signal from at least some of the connection lines or from each connection line. Moreover, the control circuit 80 can output an output signal $S_{OUT}$ indicating, for example, a proximity switching signal, a positioning signal, a speed detection signal and/or a current sensing signal based on at least one sense signal received from the active region 10 of the Hall effect device 100. The received sense signal may, for example, be processed or rendered by the control circuit or by another processing circuit (not shown in FIG. 1c) for providing the output signal $S_{OUT}$.

The control circuit 80 can also be configured to apply different phases of a spinning current operation (over the connection lines) to the terminal structures 30, 40, 50, 60 at the active Hall region 10.

The so-called spinning current operation is used to dynamically reduce the offset in the Hall effect device. To be more specific, the basic idea of the spinning current method deals with measuring the output voltage of the multi-contact Hall plate for different directions of the biasing current. Averaging the output signal over one full switching period of 360° separates the (spatially periodic) offset voltage from the Hall voltage.

To be more specific, the spinning current operation consists of continuously cyclically rotating the direction of the biasing current and, accordingly, the measurement direction for detecting the Hall voltage at the active Hall region with a certain and synchronous change of the current and measurement direction, by 360°/m for a Hall effect device 100 having m terminal structures, wherein m is a multiple of four (where m is 4, 8, 16, . . . ), for example by 90° (e.g. for a square/quadratic or 4-armed active region having four terminal structures) or for example by 45° (e.g. for an octagonal or 8-armed active region having eight terminal structures) etc., and to average all measurement signals over one full switching period of 360°.

The control circuit 80 may be configured to selectively switch on one of the pairs of opposing supply contact elements for feeding a biasing current, e.g. a control, operating or force current, in a predetermined current direction through the active Hall region 10, and to selectively switch off the remaining supply contact elements during each of the different phases of a spinning current operation.

The control circuit 80 may be further configured to sense a Hall signal between the pair of opposing sense contact elements, which are arranged orthogonally to the pair of opposing supply contact elements, which currently feed the control or biasing current to the active Hall region 10.

The control circuit 80 may be further configured to apply a first to m-th (e.g. fourth) phase, i.e. m phases, of the spinning current operation to the terminal structures at the active Hall region 10, and to cyclically rotate (e.g., continuously) the control or biasing current direction through the active Hall region 10 and to cyclically rotate (e.g., continuously) the measurement direction for detecting a Hall voltage $U_{HALL}$ at the pairs of sense contact elements.

Thus, in an example first spinning current phase (with a clockwise rotation with respect to FIG. 1c), the opposing supply contact elements 32 and 52 are selectively switched on to feed a biasing current $I_{BIAS}$ in a first current direction (from the second terminal 32b of the first transistor element 32 to the second terminal 52b of the third transistor element 52). The remaining supply contact elements (transistor elements) 42, 62 are switched off. Moreover, a Hall signal or Hall voltage $U_{HALL}$ is sensed between the pair of opposing sense contact elements 44 and 64, which are arranged orthogonally to the pair of opposing supply contact elements 32, 52, which currently feed the biasing current to the active Hall region 10 in the first biasing current direction.

In an example second spinning current phase, the opposing supply contact elements 62 and 42 are selectively switched on to feed a biasing current $I_{BIAS}$ in a second current direction (from the second terminal 62b of the fourth transistor element 62 to the second terminal 42b of the second transistor element 42). The remaining supply contact elements (transistor elements) 32 and 52 are switched off. Moreover, a Hall signal $U_{HALL}$ (i.e. a Hall voltage) is sensed between the pair of opposing sense contact elements 34 and 54, which are arranged orthogonally to the pair of opposing supply contact elements 62, 42, which currently feed the biasing current to the active Hall region 10 in the second biasing current direction.

Thus, in an example third spinning current phase, the opposing supply contact elements 52 and 32 are selectively switched on to feed a biasing current $I_{BIAS}$ in a first current direction (from the second terminal 52b of the third transistor element 52 to the second terminal 32b of the first transistor element 32). The remaining supply contact elements (transistor elements) 42, 62 are switched off. Moreover, a Hall signal $U_{HALL}$ is sensed between the pair of opposing sense contact elements 44 and 64, which are arranged orthogonally to the pair of opposing supply contact elements 52, 32, which currently feed the biasing current to the active Hall region 10 in the third biasing current direction.

In an example fourth spinning current phase, the opposing supply contact elements 42 and 62 are selectively switched on to feed a biasing current in a second current direction (from the second terminal 42b of the second transistor element 42 to the second terminal 62b of the fourth transistor element 62). The remaining supply contact elements (transistor elements) 32 and 52 are switched off. Moreover, a Hall signal (Hall voltage) is sensed between the pair of opposing sense contact elements 34 and 54, which are arranged orthogonally to the pair of opposing supply contact elements 42, 62, which currently feed the biasing current to the active Hall region 10 in the fourth biasing current direction.

The above described four-phase spinning current operation is equally applicable to example Hall effect devices having, for example, m terminals structures (where m is 4, 8, 16, . . . ), wherein the spinning current phases are then cyclically rotated by 360°/m (90°, 45°, 22.5° etc.) in order to average the output signal over one full switching period of 360°.

Moreover, the above described different phases of a spinning current operation is equally applicable to a m-phase spinning current operation in a counterclockwise direction with respect to FIG. 1c.

Moreover, the control circuit 80 of FIG. 1c may be also configured to apply the modes of a compensation operation, such as a spinning current compensation, to the terminal structures of the active Hall region 10 having the three triangular active sub-regions 10-1, 10-2, 10-3 as shown in FIG. 1b (E). The switchable supply contact elements 32, 42, 52/32', 42', 52'/32", 42", 52" and the sense contact elements 34, 44, 54/34', 44', 54'/34", 44", 54" of the active sub-regions 10-1, 10-2, 10-3 are selectively interconnectable (e.g. by means of the control device 80) in such a way to perform the different phases of the compensation operation.

The control circuit 80 of FIG. 1c may be alternatively or additionally configured to apply at least one mode of a calibration operation to the terminal structures 30, 40, 50, 60 at the active Hall region 10.

FIGS. 1d(1)-1d(2) shows a principle illustration of different modes of a calibration operation of an example Hall effect device 100 under the control of the associated controller circuit (not shown in FIGS. 1d(1)-1d(2)) according to another embodiment of the present invention.

For facilitating the explanation of the different modes of a calibration operation, only the actively used contact elements, i.e. the contact elements controlled and sensed by the controller circuit during the respective calibration operations, are described in FIGS. 1d(1)-1d(2). The remaining (unused) contact elements are indicated with "disabled".

For achieving an accurate detection and evaluation of the magnetic fields by the Hall effect device 100, an adjustment or calibration of the Hall effect device 100 may be necessary. As part of such a calibration, a predetermined magnetic field may be applied to the active region of the Hall effect device and the sensor offset is calculated from different sensor output values when the magnetic field is applied, for example, with different magnetic field strengths and/or with an absent magnetic field. Based on the resulting change of the measurement signals, e.g. the resulting Hall voltages, which are caused by the different magnetic fields in the active Hall region 10, the actual sensitivity of the Hall effect device 100 can be determined, and then used for correcting the measuring results.

In a first mode of calibration operation (calibration mode 1) as shown in FIG. 1d(1), the control circuit (not shown in FIG. 1d(1)) is configured to supply or force a biasing current $I_{BIAS}$ between the pair of opposing supply contact elements 32, 52 and to sense a measuring signal $u_{MEAS}$ between the pair of opposing sense contact elements 44, 64, wherein the pair of opposing supply contact elements 32, 52 and the pair of opposing sense contact elements 44, 64 are arranged rectangular to each other with respect to the center point 12 of the active Hall region 10.

Moreover, the control circuit is configured to repeatedly inverse (e.g. to chop or switch) the direction of the biasing current between the pair of opposing supply contact elements 32, 52, and to sense the different measuring signals $U_{MEAS}$ based on and considering the different (e.g. opposite) directions of the biasing current $I_{BIAS}$.

In a second mode of a calibration operation (calibration mode 2) as shown in FIG. 1d(1), the control circuit is configured to supply the biasing current $I_{BIAS}$ between the pair of opposing supply contact elements 32, 52 and to sense the measuring signals $U_{MEAS}$ between the further pair of opposing supply contact elements 42, 62, wherein the pair of opposing supply contact elements 32, 52 and the further pair of opposing supply contact elements 42, 62 are situated rectangular to each other with respect to the center point 12 of the active Hall region 10.

The control circuit is further configured to repeatedly inverse the direction of the biasing current between the pair of opposing supply contact elements 32, 52, and to sense the resulting measuring signals $U_{MEAS}$ based on the different directions of the biasing current $I_{BIAS}$.

In a third mode of a calibration operation (calibration mode 3) as shown in FIG. 1d(1), the control circuit is further configured to supply the biasing current $I_{BIAS}$ between the pair of opposing sense contact elements 44, 64 and to sense the measuring signal $U_{MEAS}$ between the pair of opposing supply contact elements 32, 52, wherein the pair of opposing sense contact elements 64, 44 and the pair of opposing supply contact elements 32, 52 are situated rectangular to each other with respect to the center point 12 of the active Hall region 10.

The control circuit is further configured to repeatedly inverse the direction of the biasing current $I_{BIAS}$ between the pair of opposing sense contact elements 44, 64, and to sense the resulting measuring signals based on the different directions of the biasing current $I_{BIAS}$.

In a fourth mode of a calibration operation (calibration mode 4) shown in FIG. 1d(2), the control circuit is further configured to supply the biasing current $I_{BIAS}$ between a pair of opposing sense contact elements 34, 54 and to sense the measuring signal $U_{MEAS}$ between a further pair of opposing sense contact elements 44, 64, wherein the pair of opposing sense contact elements 34, 54 and the further pair of opposing sense contact elements 44, 64 are situated rectangular to each other with respect to the center point 10 of the active Hall region.

In the calibration mode 4, the control circuit is further configured to repeatedly inverse the direction of the biasing current $I_{BIAS}$ between the pair of opposing sense contact elements 34, 54, and to sense the resulting measuring signals $U_{MEAS}$ between the further pair of opposing sense contact elements 44, 64 based on the different directions of the biasing current.

In a fifth mode of a calibration operation (calibration mode 5) as shown in FIG. 1d(2), the control circuit is further configured to supply the biasing current $I_{BIAS}$ between a pair of opposing terminal structures 30, 50, and to sense the measuring signal $U_{MEAS}$ between a further pair of opposing terminal structures 40, 60, wherein the pair of opposing terminal structures 30, 50 and the further pair of opposing terminal structures 40, 60 are situated rectangular to each other with respect to the center point of the active Hall region.

To be more specific, in the fifth calibration mode, the control circuit is configured to supply the biasing current $I_{BIAS}$ simultaneously to the supply contact element 32 and (in parallel) the sense contact element 34 of the first terminal structure 30 and to receive the biasing current $I_{BIAS}$ in parallel at the supply contact element 52 and the sense contact element 54 of the third terminal structure 50. In addition, the resulting measuring signals $U_{MEAS}$ are sensed between the second terminal structure 40 (with the supply contact element 42 and, in parallel, the sense contact element 44) and the fourth terminal structure 60 (with the supply contact element 62 and, in parallel, the sense contact element 64).

Moreover, the control circuit is further configured to repeatedly inverse the direction of the biasing current $I_{BIAS}$ between the pair of opposing terminal structures 30 and 50.

The different configurations as shown in the calibration modes 1 to 5 of FIGS. 1*d*(1)-1*d*(2) can equally be applied to other complementary pairs of the symmetrically arranged contact elements. Thus, the direction of the biasing current can alternatively or additionally be changed by +/−90° by means of the control circuit to apply the first to fifth modes of a calibration operation to other pairs of the symmetrically arranged contact elements which are, for example, offset by +/−90° when compared to the calibration configurations of FIGS. 1*d*(1)-1*d*(2).

Moreover, the control circuit 80 of FIGS. 1*d*(1)-1*d*(2) may be configured to apply at least one mode of a calibration operation, such as a spinning current compensation, to the terminal structures of the active Hall region 10 having the three triangular active sub-regions 10-1, 10-2, 10-3 as shown in FIG. 1*b*. The switchable supply contact elements 32, 42, 52/32', 42', 52'/32", 42", 52" and the sense contact elements 34, 44, 54/34', 44', 54'/34", 44", 54" of the active sub-regions 10-1, 10-2, 10-3 are selectively interconnectable (e.g. by means of the control device 80) in such a way to perform the calibration operation. In the different calibration modes, the control circuit can be further configured to repeatedly inverse the direction of the biasing current $I_{BIAS}$ through one or more of the active sub-regions 10-1, 10-2, 10-3.

During a calibration operation, multiple permutations of the (e.g. symmetrical) interconnection of the switchable supply contact elements (the force contacts) 32, 42, 52/32', 42', 52'/32", 42", 52" and the associated sense contact elements (the sense contacts) 34, 44, 54/34', 44', 54'/34", 44", 54" may be selectively performed. Based on the different measuring results during the different calibration modes, an exact calibration of the Hall effect device 10 may be achieved by means of at least one of (various) statistical or mathematical evaluation methods using the measuring results.

Figure 2A:
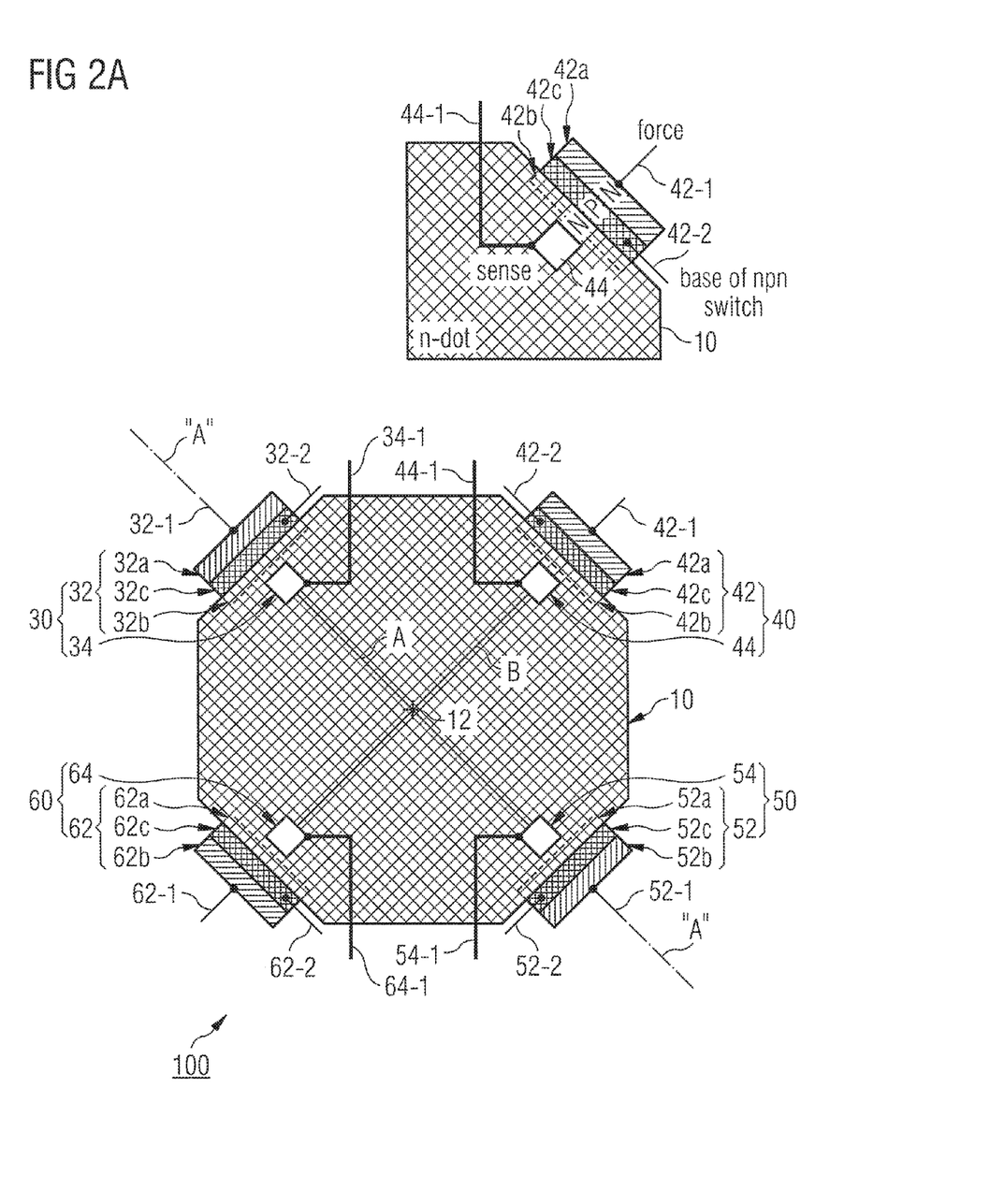
FIG. 2a shows a schematic top view of an example Hall effect device according to another embodiment of the present invention.

FIG. 2*a* shows a schematic top view of an exemplary Hall effect device 100, wherein the transistor elements 32, 42, 52, 62 respectively comprise a bipolar junction transistor. In case, the active Hall region 10 comprises an n-type conductivity, the bipolar junction transistors 32, 42, 52, 62 are npn bipolar transistors (npn switches). As shown in FIG. 2*a*, the dashed line indicates the second terminals 32*b*, 42*b*, 52*b*, 62*b* of the transistor elements 32, 42, 52, 62 which contact the active Hall region 10 or extend in the active Hall region 10. Thus, in a switched-on state of the respective transistor element 32, 42, 52, 62, the first transistor terminal 32-1, 42-1, 52-1, 62-1 is respectively part of the active Hall region 10. Thus, each terminal structure 30, 40, 50, 60 at the active Hall region or Hall plate 10 combines a broad, switchable supply contact element 32, 42, 52, 62 and a small sense contact element 34, 44, 44, 54.

During a phase of a spinning current operation (see above), when a biasing current $I_{BIAS}$ is forced through the active Hall region 10, the biasing current $I_{BIAS}$ is enabled by a semiconductor switch, e.g. in form of a bipolar junction transistor as shown in FIG. 2*a*. When the Hall signal (Hall voltage) is sensed at the respective terminal structure 30, 40, 50, 60, the neighboring broad supply contact element (force contact) is disabled (switched off) and only the "small" sense contact element is working. Thus, the active Hall region, parts of the switching elements in the form of the switchable supply contact elements and the sense contact elements are combined in the semiconductor material of the Hall effect device (Hall sensor device) 100.

In other words, in a first implementation the biasing current supply terminals (switchable supply contact elements) are operated by a bipolar junction transistor, i.e. the force contact is switched on by the npn-transistor in an operation mode for supplying the biasing current. Otherwise, the force contact is switched off by the npn-transistor, wherein the neighboring sense contact is active for sensing the Hall voltage. The bipolar junction transistors 32, 42, 52, 62 may be triggered by a control current via the controller circuit or multiplexer (not shown in FIG. 2*a*) for applying a spinning current operation or a calibration operation to the Hall effect device 100.

Figure 2B:
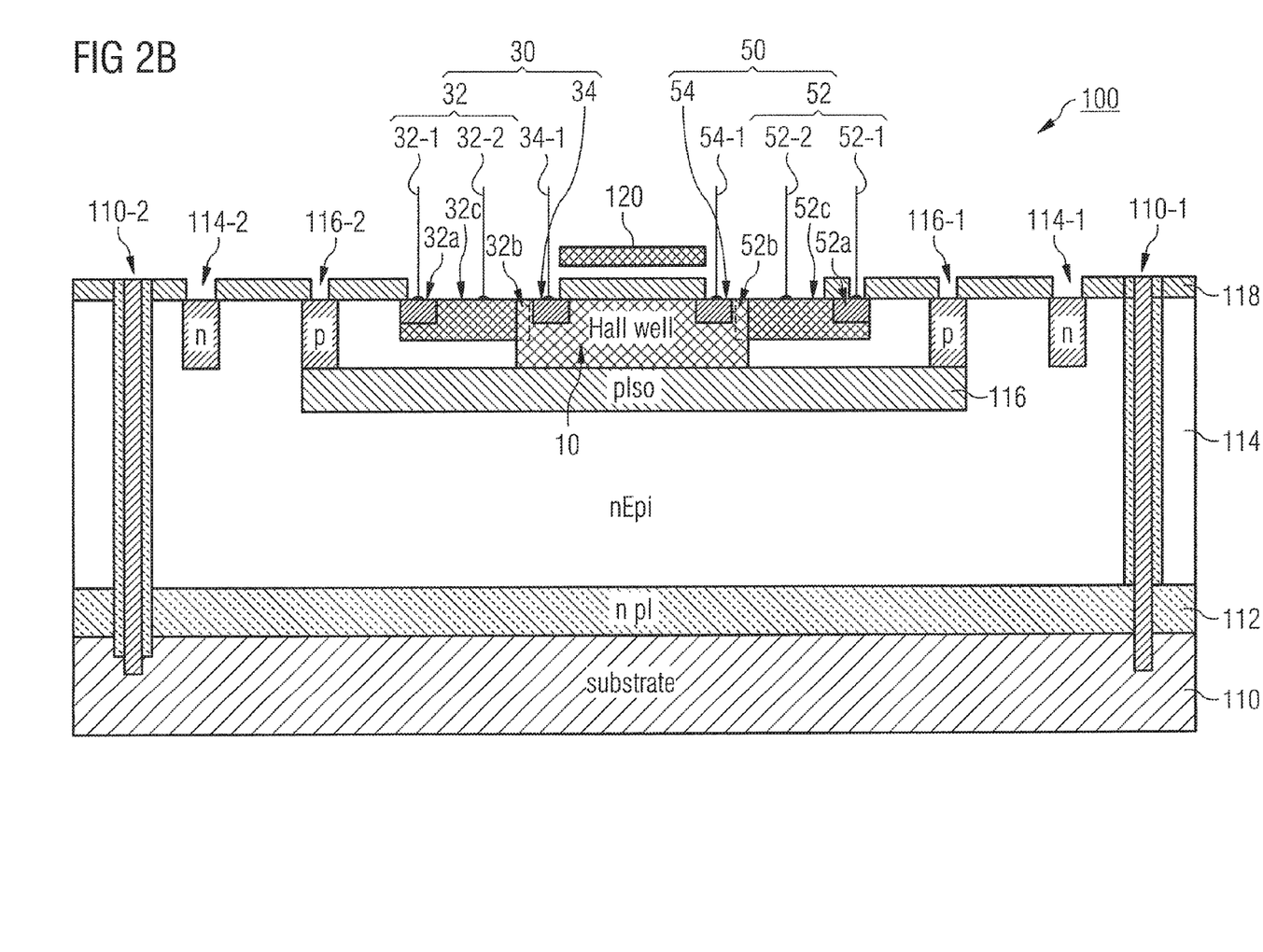
FIG. 2b shows a schematic cross-sectional view of an example Hall effect device according to another embodiment of the present invention.

FIG. 2*b* shows a schematic cross-section view of the exemplary Hall effect device along the symmetry line "A".

As shown in the cross sectional view of FIG. 2*b*, an n-epitaxy-layer 114 is formed on a substrate, e.g. a p-substrate, 110. Between the substrate and the n-epitaxy layer a buried n-layer, e.g. a n⁺-buried layer, 112 is arranged. The switchable supply contact elements 32 and 52 are implemented by means of npn transistors (bipolar junction transistors) having a first transistor terminal 32*a*, 52*a*, a second transistor terminal 32*b*, 52*b* and a control terminal (base) 32*c*, 52*c*. Moreover, the connecting lines 32-1, 32-2, 34-4 of the switchable supply contact element 32 and the connecting lines 52-1, 52-2, 54-1 of the switchable supply contact element 52 are shown.

As shown in FIG. 2*b*, the second transistor terminals 32*b*, 52*b* contact the active Hall region (or Hall well) 10 or extend in the active Hall region 10. Moreover, the sense contact elements 34, 54 are arranged in the active Hall region 10 and neighboring to the transistor elements 32, 52. Moreover, the n-epitaxy layer 114 may be at least partially covered by means of an isolation layer 118.

In FIG. 2*b*, the p-isolation layer 116 comprises contact elements 116-1, 116-2 for applying a biasing voltage to the p-isolation layer 116. Moreover, the n-epitaxy layer 114 comprises contact elements 114-1, 114-2 for providing a biasing voltage to the n-epitaxy layer 114 for providing an electronic isolation of the active Hall region 10 in a lateral direction and a depth direction from the residual n-epitaxy layer 114.

Moreover, FIG. 2*b* shows substrate contacts 110-1, 110-2 in the form of isolated vias from the surface of the epitaxy layer 114 to the substrate 110. The conductive vias 110-1, 110-1 may be isolated from the material of the n-epitaxy layer 114 and the n-layer 112 by means of a isolation material surrounding the conducting core. As shown in FIG. 2*b*, a metal-1-layer 120 is indicated over the surface of the isolation layer 118, wherein the metal-1-layer (or further metal layers) can provide a wiring for the Hall effective device 100.

The Hall effect device 100 of FIG. 2b is formed in the n-epitaxy-layer 114. In other words, the active Hall region 10 in the form of a n-well is formed in or on the top of the n-epitaxy-layer 114, wherein the n-epitaxy-layer 114 (n-epi-layer) comprises an isolation arrangement 116 (p-iso-layer) to isolate the active Hall region 10 in a lateral direction and a depth direction from the n-epitaxy-layer 114, the substrate 110, and/or other electronic devices in the substrate 110 or the n-epitaxy-layer 114.

With respect to the above described Hall effect device 100, it should be noted that also complementary conductivity types, such as a p-type active Hall region 10 and pnp-transistors 32, 42, 52 62, etc., are equally applicable to the inventive concept.

Figure 3A:
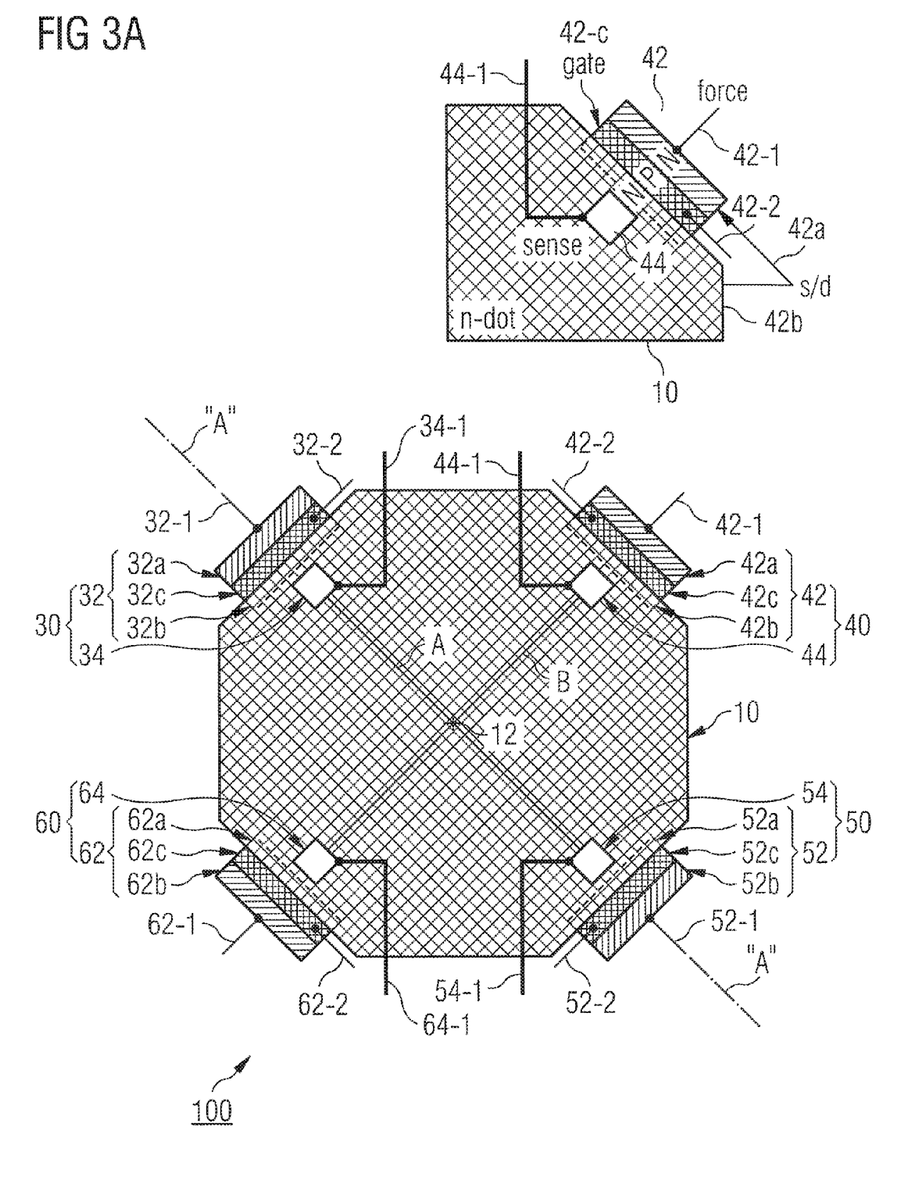
FIG. 3a shows a schematic top view of an example Hall effect device according to another embodiment of the present invention.

FIG. 3a shows a schematic top view of an example Hall effect device 100, wherein the transistor elements 32, 42, 52, 62 respectively comprise field effect transistors, such as CMOS transistors. In case, the active Hall region 10 comprises an n-type conductivity, the field effect transistors 32, 42, 52, 62 are n-channel field effect transistors. As shown in FIG. 3a, the dashed line indicates the second terminals 32b, 42b, 52b, 62b of the transistor elements 32, 42, 52, 62 which contact the active Hall region 10 or extend in the active Hall region 10. Thus, in a switched-on state of the respective transistor element 32, 42, 52, 62, the second transistor terminal 32b, 42b, 52b, 62b is respectively part of the active Hall region 10. Thus, each terminal structure 30, 40, 50, 60 at the active Hall region 10 combines a broad, switchable supply contact element 32, 42, 52, 62 and a small sense contact element 34, 44, 44, 54.

During a phase of a spinning current operation (see above), when a biasing current $I_{BIAS}$ is forced through the active Hall region 10, the biasing current $I_{BIAS}$ is enabled by a semiconductor switch, e.g. in form of a field effect transistor as shown in FIG. 3a. When the Hall signal $U_{HALL}$ is sensed at the respective terminal structure 30, 40, 50, 60, the neighboring broad supply contact element (force contact) is disabled (switched off) and only the "small" sense contact element is working. Thus, the active Hall region, at least parts of the switching elements in the form of the switchable supply contact elements and the sense contact elements are combined in the semiconductor material of the Hall effect device.

In other words, in a second implementation the biasing current supply terminals (switchable supply contact elements) are operated by a field effect transistor, i.e. the force contact is switched on by the CMOS-transistor in an operation mode for supplying the biasing current. Otherwise, the force contact is switched off by the CMOS-transistor, wherein the neighboring sense contact is active for sensing the Hall voltage. The field effect transistors 32, 42, 52, 62 may be triggered by a control current via a controller circuit or multiplexer (not shown in FIG. 3a) for applying a spinning current operation or a calibration operation to the Hall effect device 100.

With respect to the above described Hall effect device 100, it should be noted that also complementary conductivity types, such as a p-type active Hall region 10 and p-channel field effect transistors 32, 42, 52 62, etc., are equally applicable to the inventive concept.

Figure 3B:
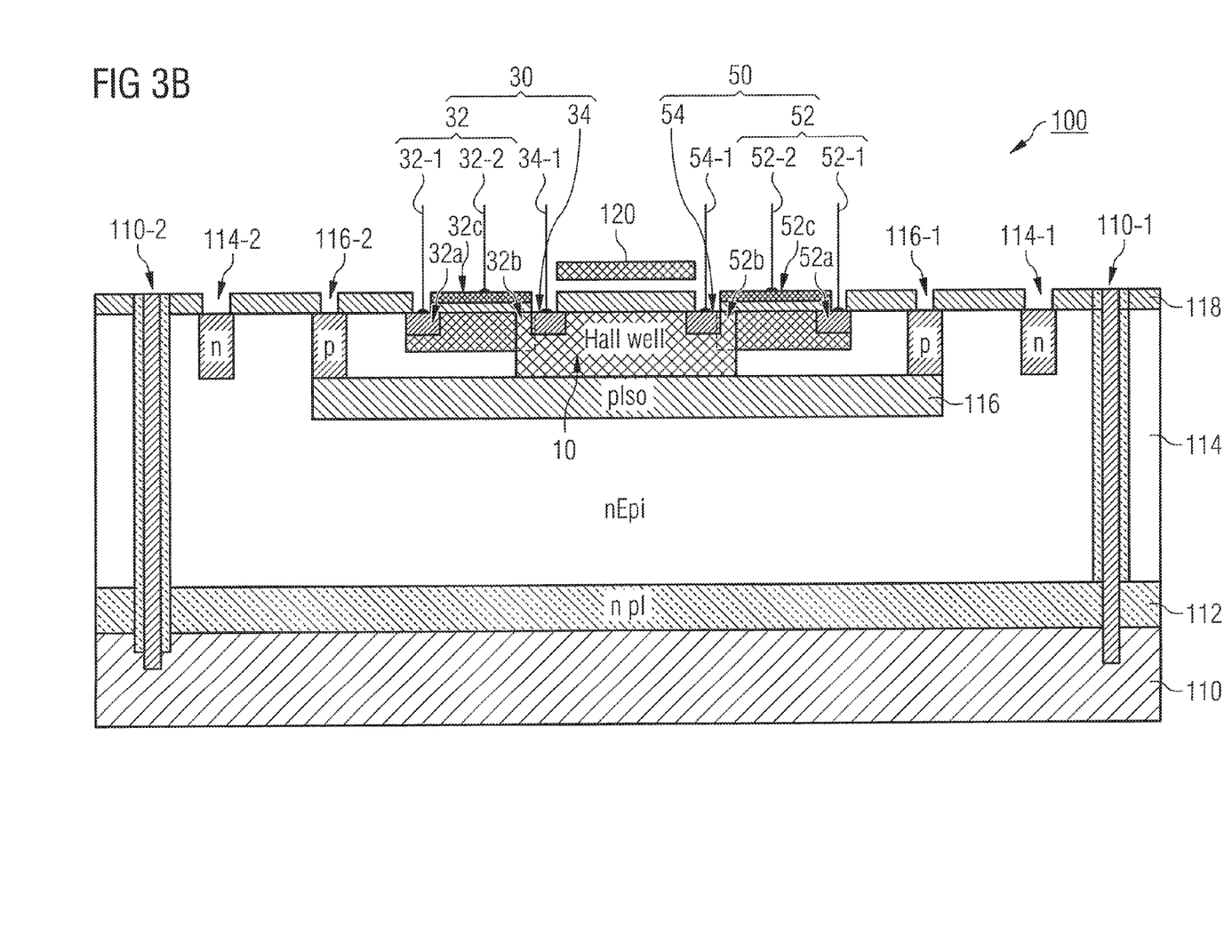
FIG. 3b shows a schematic cross-sectional view of an example Hall effect device according to another embodiment of the present invention.

FIG. 3b shows a schematic cross-section view of the exemplary Hall effect device along the symmetry line "A".

As shown in the cross sectional view of FIG. 3b, the switchable supply contact elements 32 and 52 are implemented by means of CMOS transistors (field effect transistors) having a first transistor terminal 32a, 52a, a second transistor terminal 32b, 52b and a control terminal (gate) 32c, 52c. Moreover, the connecting lines 32-1, 32-2, 34-4 of the switchable supply contact element 32 and the connecting lines 52-1, 52-2, 54-1 of the switchable supply contact element 52 are shown. The second transistor terminals 32b, 52b contact the active Hall region 10 or extend in the active Hall region 10. Moreover, the sense contact elements 34, 54 are arranged in the active Hall region 10 and neighboring to the transistor elements 32, 52.

The further elements shown in FIG. 3b may have the same structure and functionality as the respective elements shown in FIG. 2b. Thus, the description provided above for the elements in FIG. 2b are equally applicable to the further elements in FIG. 3b having the same reference numbers.

Figure 4:
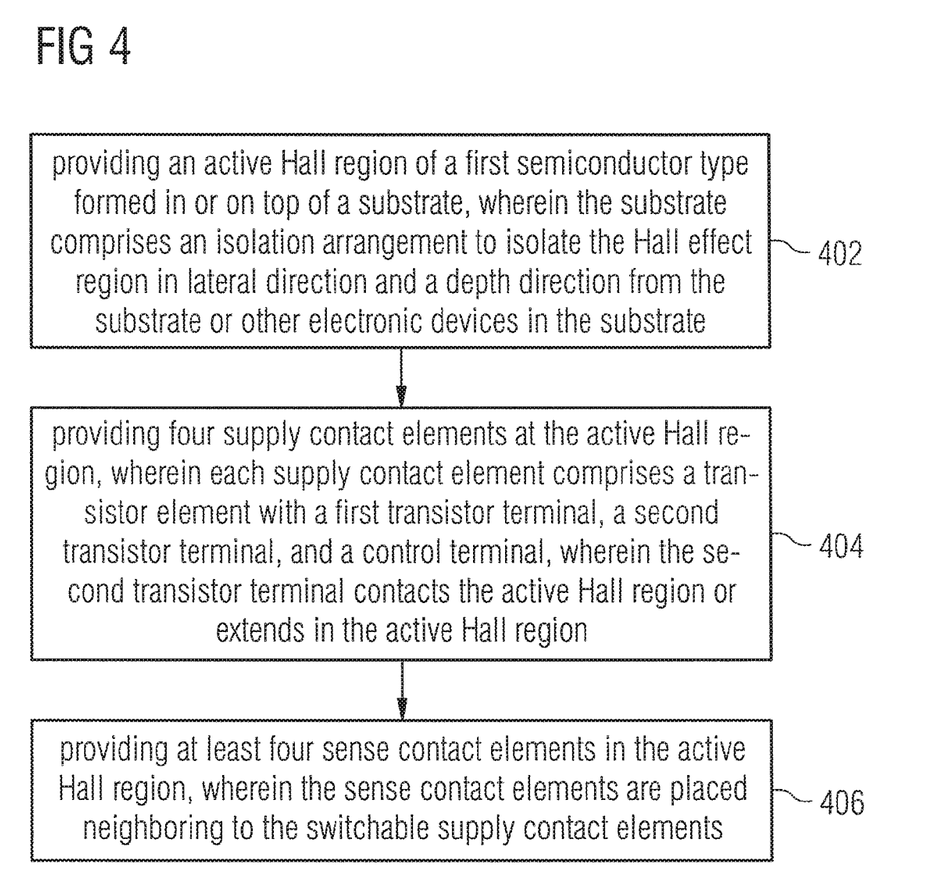
FIG. 4 shows a flowchart of a method for manufacturing a Hall effect device according to another embodiment of the present invention.

FIG. 4 shows a flowchart of a method 400 for manufacturing a Hall effect device indicative of a magnetic field according to an embodiment. At 402, an active Hall region of a first semiconductor type formed in or on top of a substrate is provided, wherein the substrate comprises an isolation arrangement to isolate the Hall effect region in lateral direction and a depth direction from the substrate or other electronic devices in the substrate. At 404, four supply contact elements at the active Hall region are provided, wherein each supply contact element comprises a transistor element with a first transistor terminal, a second transistor terminal, and a control terminal, wherein the second transistor terminal contacts the active Hall region or extends in the active Hall region. Moreover, at 404, at least four sense contact elements in the active Hall region are provided, wherein the sense contact elements are placed neighboring to the switchable supply contact elements.

When summarizing the above described embodiments it becomes clear that the magnetic sensitivity of a Hall effect element is dependent on the geometry of the sense contacts of the active Hall region. Small sense contacts give a higher magnetic sensitivity than broad contacts, the effect increases the sensitivity in a range of about 25%. When designing a rectangular active Hall region these sense contacts can be optimized for a reproducibility, resistance, process requirements and magnetic sensitivity.

In order to reduce a loss of sensitivity and to provide a balance with low offset and jitter, the Hall effect devices 100 combines in each terminal of the active Hall region 10, a (relatively) broad force contact and a (relatively) small sense contact. When a bias current is forced, the current is enabled by a semiconductor switch 32, 42, 52, 62, e.g. a CMOS transistor or a bipolar transistor. When the Hall voltage $U_{HALL}$ is sensed, the neighboring broad force contact is disabled and only the small sense contact is working. The Hall plate 10, the sensing elements 34, 44, 54, 64 and the switching elements 32, 42, 52, 62 are combined in the Hall sensor device 100.

In a first operation mode of the Hall effective device 100, the respective force contact will be switched on by the npn transistor, otherwise the sense contact is active. The npn transistor will be triggered by the force current via multiplexing (e.g. for providing a spinning current mode).

In a second operation mode of the Hall effective device 100, the respective force contacts will be switched on by the CMOS transistor, otherwise the sense contact is active. The CMOS transistor will be triggered by the force current via multiplexing (e.g. for providing a spinning current mode). The resulting Hall effect device 100 realizes an area optimized implementation of operated sense contacts 34, 44, 54, 64 and force contacts 32, 42, 52, 62.

The Hall effect device 100 achieves a high sensitivity and provides a balance with low offset and jitter.

In the present application an electrical coupling between two terminals should be understood as a direct low ohmic coupling or an indirect coupling with one or more elements between, such that a signal at a second node is dependent on a signal at a first node, which is coupled to the second node. Between two coupled terminals a further element may be coupled, but not necessarily need to be, such that two terminals which are coupled to each other may be also directly connected to each other (e.g. by means of a low impedance connection, such as a wire or a wire trace).

Furthermore, according to the present application a first terminal is directly connected to a second terminal, if a signal at the second terminal is equal to a signal at the first terminal, wherein parasitic effects or minor losses due to conductor resistances shall not be regarded. In other words, two terminals which are directly connected to each other are typically connected by means of wire traces or wires without additional elements in between.

Furthermore, according to the present application, a first terminal of a transistor may be a source terminal or an emitter terminal of the transistor or may be a drain terminal or a collector terminal of the transistor. A second terminal of the transistor may be a drain terminal or a collector terminal of the transistor or may be a source terminal or an emitter terminal of the transistor. A control terminal of the transistor may be a gate terminal or a base terminal of the transistor. Therefore, a switchable path of a transistor may be a drain source path of a field-effect transistor or an emitter collector path of a bipolar junction transistor. A main transistor current is typically routed from the first terminal to the second terminal of the transistor or vice versa.

Furthermore two nodes or terminals are electrically coupled if a coupling path (e.g. a switchable path of a transistor) between the two coupled nodes or terminals is in a low impedance state and are electrically decoupled if the coupling path is in a high impedance state.

The methods described herein may be supplemented by any of the features and functionalities described herein with respect to the apparatus, and may be implemented using the hardware components of the apparatus.

Although some aspects have been described in the context of an apparatus or controller, it is clear that these aspects also represent a description of the corresponding method, where a block or device corresponds to a method step or a feature of a method step. Analogously, aspects described in the context of a method step also represent a description of a corresponding block or item or feature of a corresponding apparatus or controller. Some or all of the method steps may be executed by (or using) a hardware apparatus, like for example, a microprocessor, a programmable computer or an electronic circuit. In some embodiments, some one or more of the most important method steps may be executed by such an apparatus.

Depending on certain implementation requirements, embodiments of the invention can be implemented in hardware or in software. The implementation can be performed using a digital storage medium, for example a floppy disk, a DVD, a Blue-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Some embodiments according to the invention comprise a data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may for example be stored on a machine readable carrier.

Other embodiments comprise the computer program for performing one of the methods described herein, stored on a machine readable carrier.

In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein. The data carrier, the digital storage medium or the recorded medium are typically tangible and/or non-transitionary.

A further embodiment of the inventive method is, therefore, a data stream or a sequence of signals representing the computer program for performing one of the methods described herein. The data stream or the sequence of signals may for example be configured to be transferred via a data communication connection, for example via the Internet.

A further embodiment comprises a processing means, for example a computer, or a programmable logic device, configured to or adapted to perform one of the methods described herein.

A further embodiment comprises a computer having installed thereon the computer program for performing one of the methods described herein.

A further embodiment according to the invention comprises an apparatus or a system configured to transfer (for example, electronically or optically) a computer program for performing one of the methods described herein to a receiver. The receiver may, for example, be a computer, a mobile device, a memory device or the like. The apparatus or system may, for example, comprise a file server for transferring the computer program to the receiver.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods are preferably performed by any hardware apparatus.

The above described embodiments are merely illustrative for the principles of the present invention. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

Although each claim only refers back to one single claim, the disclosure also covers any conceivable combination of claims.

The invention claimed is:

1. A method of manufacturing a Hall effect device indicative of a magnetic field, comprising:

providing an active Hall region of a first semiconductor type formed in or on top of a substrate, wherein the substrate comprises an isolation arrangement to isolate the active Hall effect region in a lateral direction and a depth direction from the substrate or other electronic devices in the substrate;

providing a plurality of switchable supply contact elements at the active Hall region, wherein each switchable supply contact element comprises a transistor element with a first transistor terminal, a second transistor terminal, and a control terminal, wherein the second transistor terminal contacts the active Hall region or extends in the active Hall region; and providing a plurality of sense contact elements in the active Hall region, wherein the sense contact elements are placed neighboring to the switchable supply contact elements, and wherein the sense contact elements and the switchable supply contact elements are separately connected to the Hall region.

2. The method according to claim 1, wherein the terminal structures are provided to form a first pair of opposing terminal structures and a second pair of opposing terminal structures, and wherein a first conjugation line between the opposing terminal structures of the first pair and a second conjugation line between the opposing terminal structures of the second pair orthogonally intersect in a center point of the active Hall region.

3. The method according to claim 1, wherein the active Hall region is provided to have a boundary line in form of a n-sided polygon, wherein n is at least three.

4. The method according to claim 1, wherein the active Hall region is provided to have a boundary line in form of a n-sided regular polygon, wherein n is 4 or a multiple of 4.

5. The method according to claim 1, wherein the active Hall region is provided to have a boundary line in form of a n-armed cross, wherein n is at least three.

6. The method according to claim 1, wherein the active Hall region is provided to have a boundary line in form of a n-armed cross, wherein n is 4 or a multiple of 4.

7. The method according to claim 1, further comprising:
providing a control circuit for controlling an operation of the Hall effect device.

8. The method according to claim 1, wherein the transistor element is formed as a bipolar junction transistor or a field effect transistor.

9. The method according to claim 1, wherein the active Hall region is provided to comprise three triangular active sub-regions.

* * * * *